United States Patent
Hayashi

(10) Patent No.: US 7,548,126 B2
(45) Date of Patent: Jun. 16, 2009

(54) PHASE LOCKED LOOP CIRCUIT AND CONTROL METHOD THEREOF

(75) Inventor: Tomohiro Hayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/303,502

(22) Filed: Dec. 17, 2005

(65) Prior Publication Data
US 2006/0132244 A1 Jun. 22, 2006

(30) Foreign Application Priority Data
Dec. 17, 2004 (JP) ............................. 2004-366034

(51) Int. Cl.
 *H03B 27/00* (2006.01)
(52) U.S. Cl. ...................... 331/57; 331/16; 331/34; 331/185; 327/156; 327/159
(58) Field of Classification Search ................... 331/57, 331/34, 182, 183, 185, 16; 327/156, 159
See application file for complete search history.

(56) References Cited
U.S. PATENT DOCUMENTS 5,942,949 A * 8/1999 Wilson et al. ................. 331/17
6,072,372 A * 6/2000 Yokoyama .................. 331/57
6,144,242 A * 11/2000 Jeong et al. ................. 327/269
7,298,219 B2 * 11/2007 Dosho et al. ................. 331/16

FOREIGN PATENT DOCUMENTS

| JP | 6-38116 | 2/1994 |
| JP | 6-342566 | 12/1994 |
| JP | 2004-56434 | 2/2004 |

* cited by examiner

*Primary Examiner*—Arnold Kinkead
(74) *Attorney, Agent, or Firm*—Dickstein Shapiro LLP

(57) ABSTRACT

A phase locked loop circuit includes a voltage controlled oscillator having an oscillating characteristic value changed by a switching signal. A characteristic controller supplies the switching signal to the voltage controlled oscillator to increase the oscillating characteristic value according to elapse of time. The voltage controlled oscillator oscillates according to both of the oscillating characteristic value and a frequency control signal. Even if the frequency control signal is equal to a power source level at the beginning of supplying electric power, the phase locked loop can be locked in a target frequency.

13 Claims, 7 Drawing Sheets

PHASE LOCKED LOOP CIRCUIT AND CONTROL METHOD THEREOF

This application claims priority to prior application JP 2004-366034, the disclosure of which is incorporated herein by reference.

BACKGROUND OF THE INVENTION

This invention relates to a phase locked loop (PLL) circuit for use in a semiconductor integrated circuit to generate a clock signal, particularly to a PLL circuit including a voltage controlled oscillator capable of changing an oscillating frequency characteristic against a control voltage and to a control method thereof.

A conventional PLL circuit comprises a phase comparator, a charge pump, a loop filter, a voltage controlled oscillator (VCO), and a frequency divider, which are connected one another in this order to form a feedback loop. The VCO has a fixed oscillating frequency characteristic representing oscillating frequency against control voltage. The oscillating frequency characteristic corresponds to a gain factor which may either change according to the control voltage or be fixed regardless of the control voltage. When the gain factor is fixed, the oscillating frequency is represented as a liner function of the control voltage.

The PLL circuit produces an output clock signal according to a reference clock signal so that a frequency of a divided clock signal from the frequency divider is equal to that of the reference clock signal.

In the PLL circuit, there is fear that the frequency of the output clock signal overshoots a target frequency by the time when the PLL circuit is locked at the target frequency.

Furthermore, when the frequency of the output clock signal goes over a frequency band of a feedback path of the PLL circuit, the clock signal disappears from the feedback path. Thus, there is a case where the PLL circuit can not be locked.

Such a conventional phase locked loop circuit is disclosed in Japanese Patent Unexamined Publication No. 6-342566.

The phase locked loop circuit disclosed in Japanese Patent Unexamined Publication No. 6-342566 includes a voltage controlled oscillator having two gain factors. However, the larger one of the gain factors is employed at the beginning of the operation to be locked quickly. Then the smaller one of the gain factors is employed after the phase locked loop circuit is locked once.

SUMMARY OF THE INVENTION

It is therefore an object of this invention to provide a phase locked loop circuit capable of suppressing overshoot of an output clock signal.

Other objects of this invention will become clear as the description proceeds.

According to an aspect of this invention, a phase locked loop circuit comprises a phase comparator to compare a phase of a feedback signal with that of a reference clock signal. A charge pump is connected to the phase comparator to produce an analog signal corresponding to a pulse width of an output signal from the phase comparator. A loop filter is connected to the charge pump to smooth the analog signal and to produce a frequency control signal. A voltage controlled oscillator is connected to the loop filter to produce an output clock signal according to an oscillating characteristic value and the frequency control signal. A frequency divider is connected between the voltage controlled oscillator and the phase comparator to divide the output clock signal and to supply a divided signal as the feedback signal to the phase comparator. The voltage controlled oscillator increases the oscillating frequency characteristic value stepwise by means of controlling a delay value of a delay circuit included therein according to a switching signal.

According to another aspect of this invention, a phase locked loop circuit comprises a voltage controlled oscillator which employs one of oscillating frequency characteristics according to a switching signal. An oscillating characteristic controller is connected to the voltage controlled oscillator to change the switching signal according to an elapsed time.

According to a still another aspect of this invention, a controlling method is for controlling a phase locked loop circuit. The controlling method comprises the steps of producing a switching signal changed according to an elapsed time, and supplying the switching signal to a voltage controlled oscillator to employ one of oscillating frequency characteristics.

DESCRIPTION OF THE PREFERRED EMBODIMENT

Figure 1:
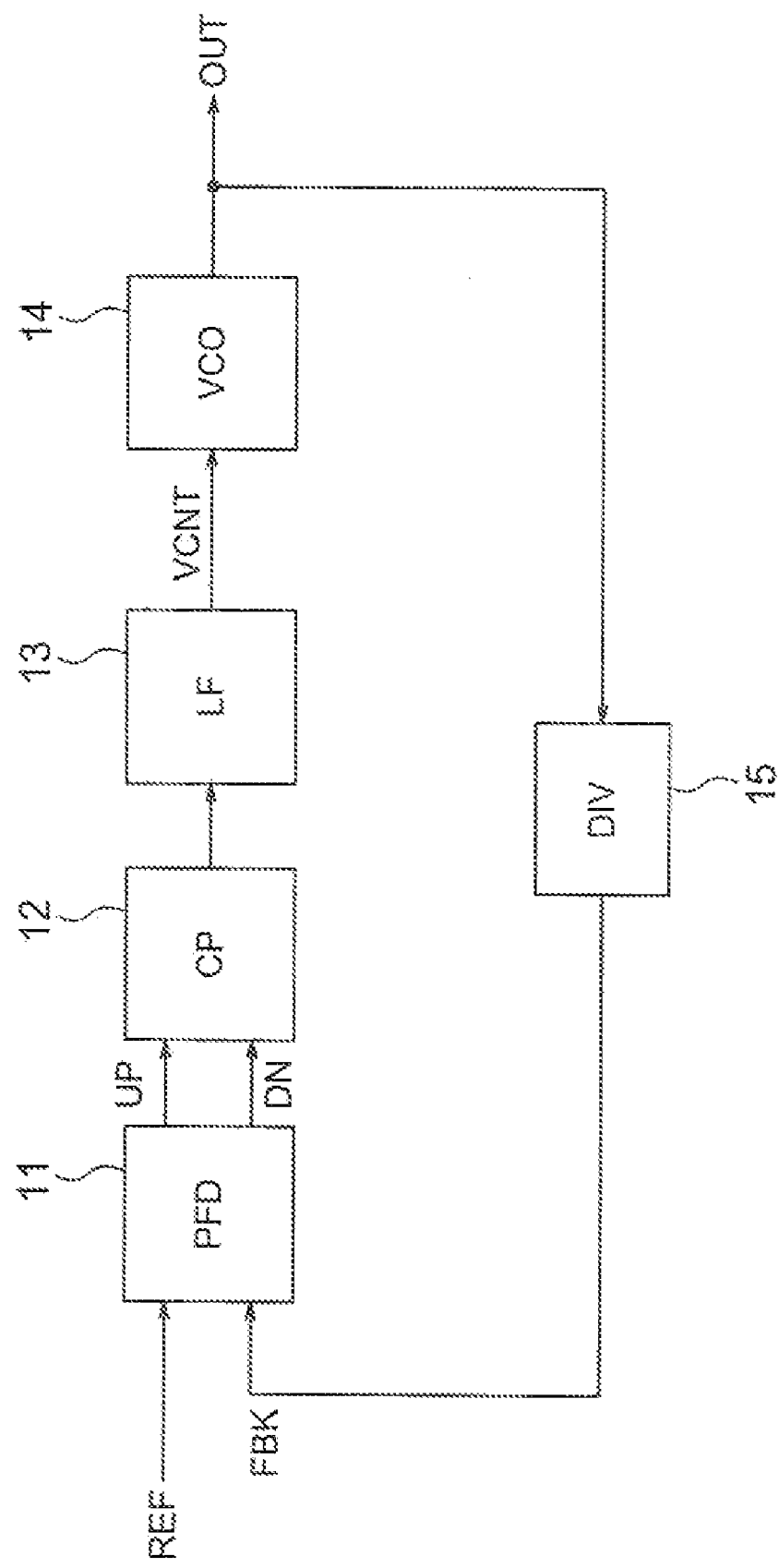
FIG. 1 is a block diagram showing a configuration of a conventional phase locked loop circuit.
Figure 2:
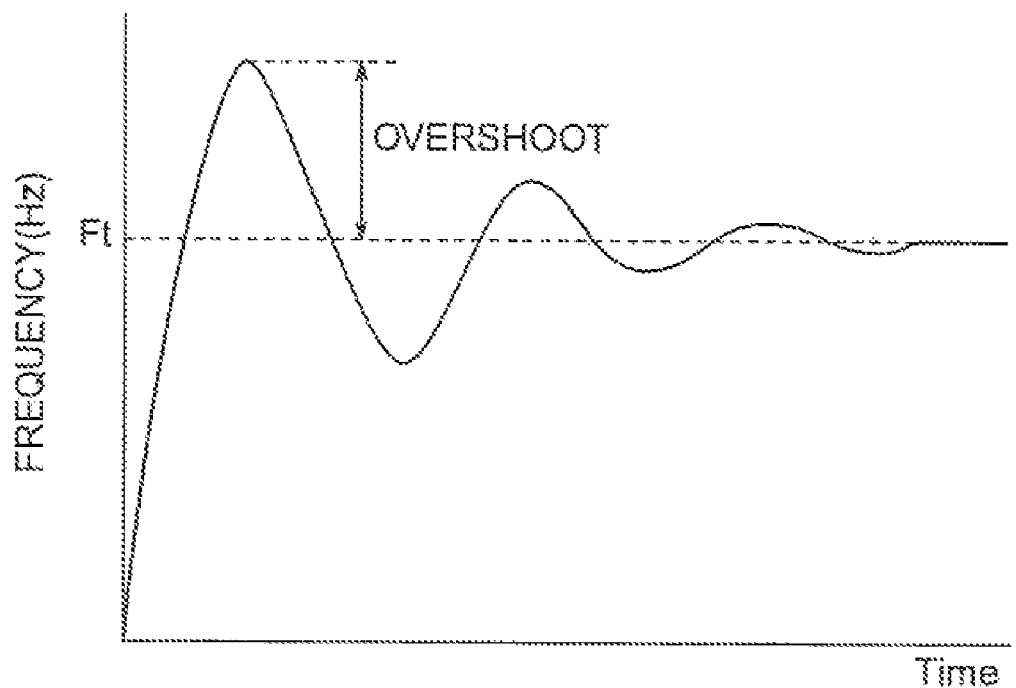
FIG. 2 is a graph showing frequency transition of an output clock signal of the conventional phase locked loop circuit of FIG. 1.

Referring to FIGS. 1 and 2, a description will be first directed to a conventional phase locked loop (PLL) circuit.

In FIG. 1, the conventional PLL circuit includes a phase comparator (PFD) 11, a charge pump (CP) 12, a loop filter (LF) 13, a voltage controlled oscillator (VCO) 14, and a frequency divider (DIV) 15.

The phase comparator 11 receives a reference clock signal REF having a reference frequency and a feedback signal FBK having a feedback frequency to compare the feedback frequency with the reference frequency. The phase comparator 11 produces up and down signals UP and DN according to comparison result thereof.

The charge pump 12 receives the up and the down signals UP and DN from the phase comparator 11 to produce an analog signal according to pulse width decided by the up and the down signals UP and DN.

The loop filter 13 smoothes the analog signal from the charge pump 12 to produce a frequency control signal (or a control voltage) VCNT which is supplied to the voltage controlled oscillator (hereinafter abbreviated to VCO) 14.

The VCO 14 produces an output clock signal having a clock frequency according to the frequency control signal VCNT. The output clock signal is supplied to both of an external circuit (not shown) and the frequency divider 15.

The frequency divider 15 divides the output clock signal by a dividing factor N to produce a divided signal having a divided frequency. The divided signal is supplied to the phase comparator 11 as the feedback signal FBK. The divided frequency corresponds to the feedback frequency.

As mentioned above, the output clock signal is divided and fed back to the phase comparator 11 to form a feedback loop. Thus the conventional PLL circuit generates the output clock signal having the clock frequency which is N times of the reference frequency.

The conventional PLL circuit has a loop characteristic depending on charge and discharge current values of the charge pump 12, a resistance value and a capacitance value of the loop filter 13, an oscillating frequency characteristic (or a gain factor of the VCO) against the control voltage VCNT of the VCO 14, and the dividing factor N of the divider 15. The loop characteristic decides frequency transition of the output clock signal from the beginning of supplying electric power to the time when the clock frequency is locked. FIG. 2 shows an example of the frequency transition of the output clock signal.

In FIG. 2, horizontal and vertical axes correspond to time and a frequency, respectively. A target frequency Ft and frequency transition are depicted by a broken line and a solid line, respectively.

As shown in FIG. 2, some overshoots of the clock frequency is caused by the conventional PLL circuit. The overshoots have amplitudes depending on the loop characteristic. The first one of the overshoots can be intentionally caused by designing the loop characteristic to lock the clock frequency quickly.

If the overshoot is too large, there is a case where the clock frequency goes over a frequency band of a feedback path from the VCO 14 to the phase comparator 11 through the divider 15. In such a case, the output clock signal disappears from the feedback path. The disappearance of the output clock signal disables the PLL circuit for detecting the overshoot and being locked. The unexpected large overshoot is caused by uneven manufacturing quality of the charge pump 12, the loop filter 13, and/or the VCO 14.

On the other hand, there is a case where the frequency control signal VCNT is not equal to a ground level but to a level of a power source at the beginning of supplying the electric power. In such a case, the VCO 14 starts to oscillate at the maximum frequency as an operating limit. Consequently, there is a case where the clock frequency goes over the frequency band of the feedback path and the PLL circuit cannot be locked depending on the oscillating frequency characteristic.

Referring to FIGS. 3 to 7, a description will proceed to a phase locked loop (PLL) circuit according to a preferred embodiment of this invention. Similar parts are designated by like reference numerals and their explanation is omitted.

Figure 3:
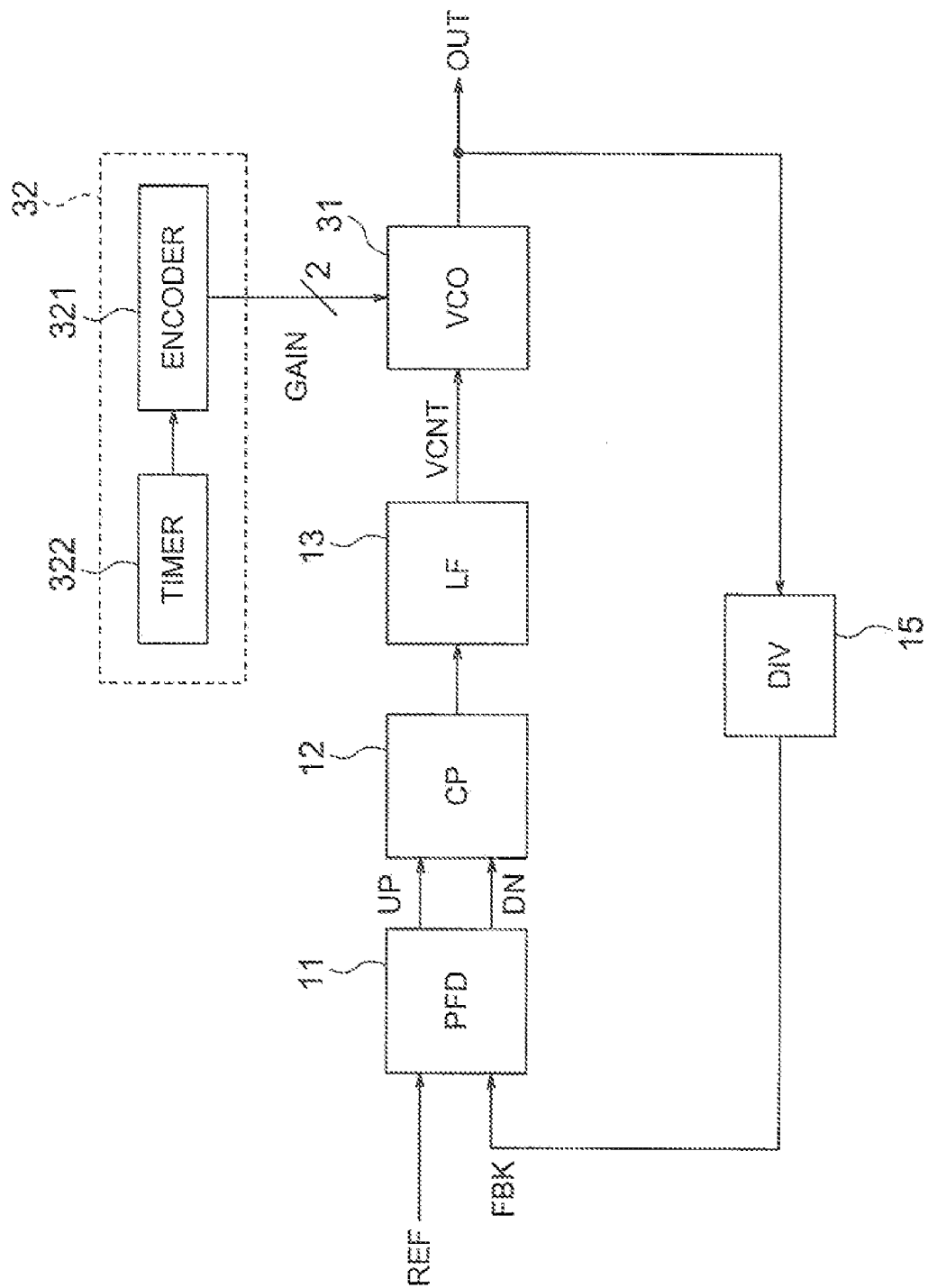
FIG. 3 is a block diagram showing a configuration of a phase locked loop circuit according to a preferred embodiment of this invention.

In FIG. 3, the PLL circuit includes a voltage controlled oscillator (VCO) 31 as a substitute for the VCO 14 and a gain control circuit 32.

Differently from the VCO 14, the VCO 31 has a plurality of oscillating frequency characteristics against the frequency control signal VCNT from the loop filter 13. The VCO 31 employs one of the oscillating frequency characteristics according to a gain switching signal GAIN supplied from the gain control circuit 32. In other words, the VCO 31 changes the oscillating frequency characteristic according to the gain switching signal GAIN. The VCO 31 produces an output clock signal by the use of the employed oscillating frequency characteristic.

Hereinafter, it is assumed that the frequency of the output clock signal is proportional to the control voltage (or the frequency control signal) VCNT even if any one of the oscillating frequency characteristics is employed. In such a case, the oscillating frequency characteristics maybe represented by gain factors, which are different from one another, as oscillating characteristic values.

The gain control circuit 32 includes an encoder 321 and a timer 322. The encoder 321 produces the gain switching signal GAIN composed of a plurality of bit signals. The bit signals are transmitted to the VCO 31 through a parallel line including signal lines corresponding to the bit signals. The timer 322 decides timing for supplying the gain switching signal GAIN to the VCO 31 and for changing the, gain switching signal GAIN.

If the gain switching signal GAIN represents two bits, the VCO 31 may have four gain factors. The gain control circuit 32 produces the gain switching signal GAIN so that the VCO 31 employs the gain factors one by one in ascending order as time elapses. Thus, the VCO 31 increases the employed gain factor stepwise from when the operation starts, and thereby an overshoot is suppressed as much as possible. Accordingly, a lock operation of the PLL circuit is assured regardless of voltage level of the frequency control signal VCNT at the beginning of the operation.

Next, referring to FIGS. 4 and 5, the VCO 31 will be described more specifically.

Figure 4:
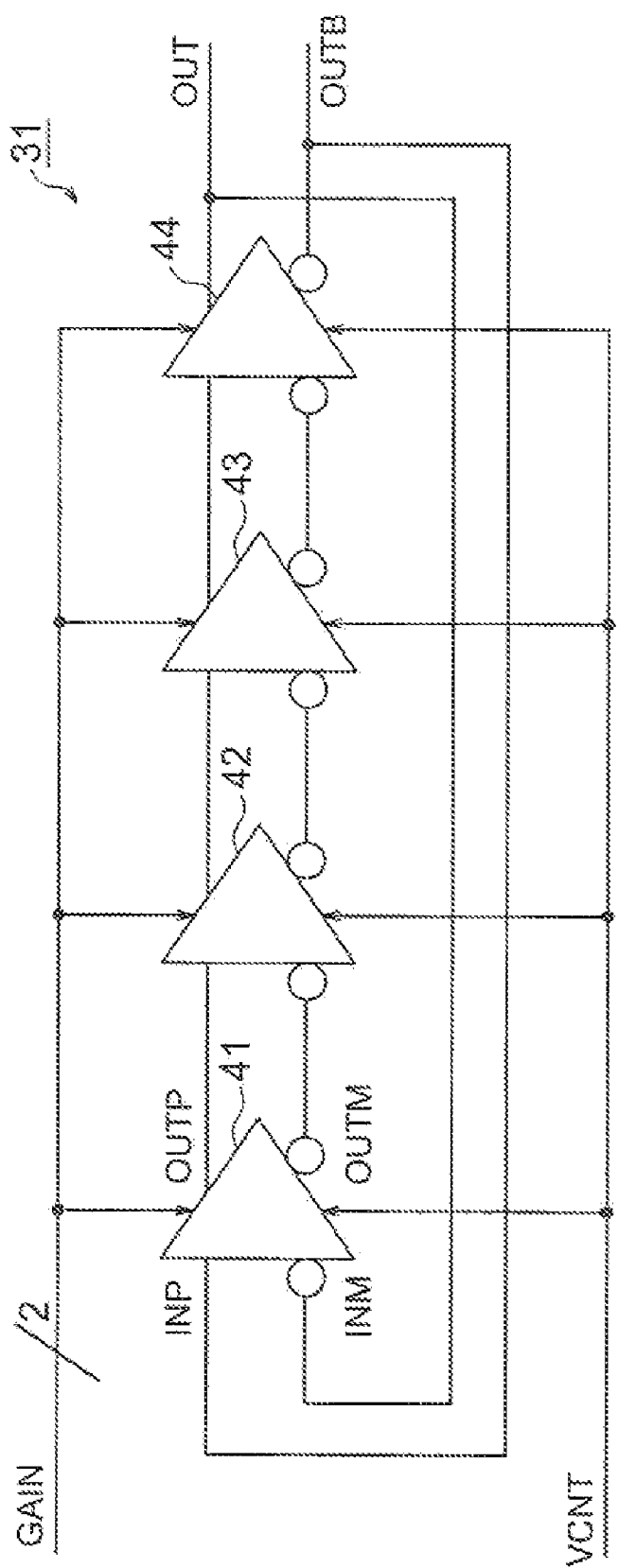
FIG. 4 is a circuit diagram of a voltage controlled oscillator for use in the phase locked loop circuit of FIG. 3.
Figure 5:
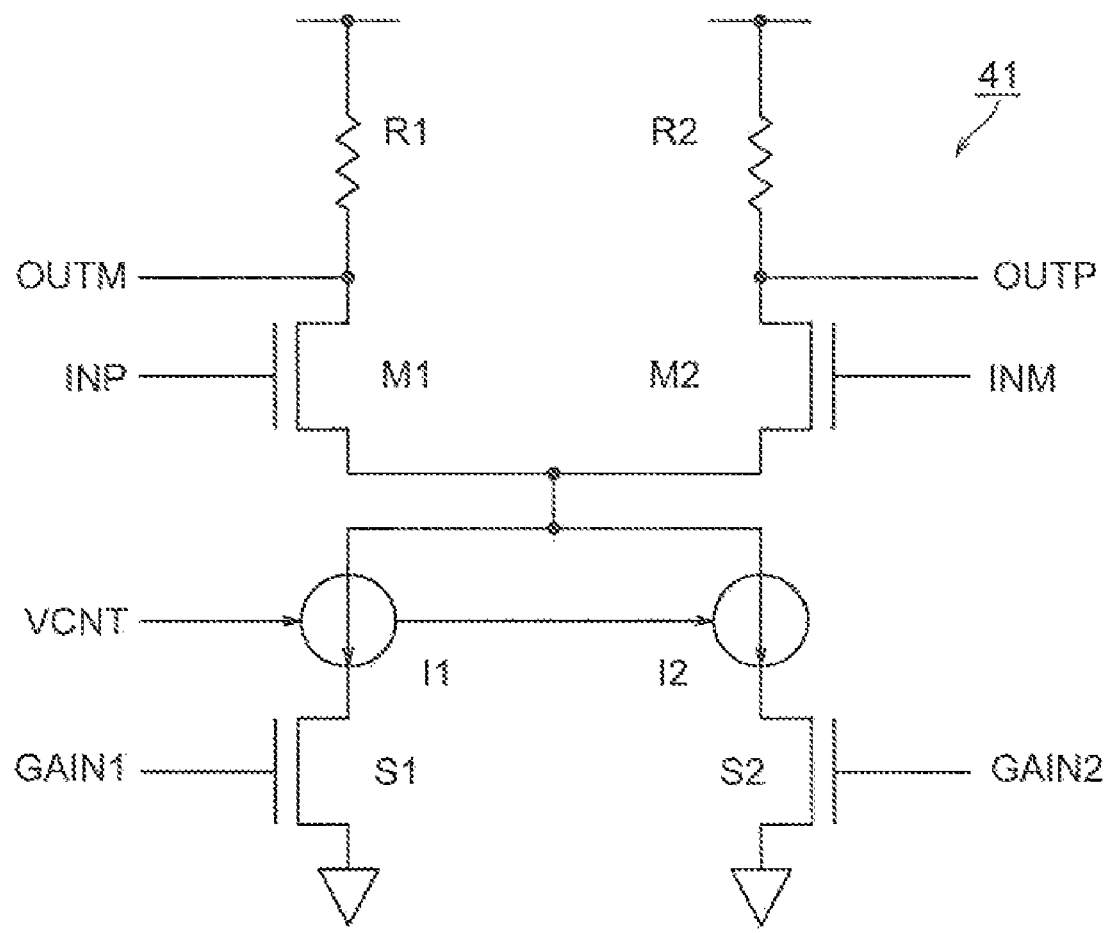
FIG. 5 is a circuit diagram of a delay circuit for use in the voltage controlled oscillator of FIG. 4.

FIG. 4 is a block diagram showing circuitry of the VCO 31 while FIG. 5 is a circuit diagram of a delay circuit included in the VCO 31.

As shown in FIG. 4, the VCO 31 has a plurality of delay circuits 41-44 connected to one another in a loop. The number of the delay circuits 41-44 is equal to that of the gain factors. Hereinafter the number is four on assumption that the gain switching signal GAIN represents two bits.

Each of the delay circuits 41-44 has positive and negative input terminals INP and INM and positive and negative output terminals OUTP and OUTM. The positive and the negative output terminals OUTP and OUTH of first to third delay circuits 41-43 are connected to the positive and the negative input terminals INP and INM of second to fourth delay circuits 42-33, respectively. On the other hand, the positive and the negative output terminals OUTP and OUTM of the fourth circuit 44 are connected to the negative and the positive input terminals INM and INP of the first delay circuit 41. Thus, the VCO 31 oscillates because one pair of the connections between two delay circuits is contrary to the other pairs in the loop of the delay circuits. The oscillating frequency characteristics depend on a total delay value of the delay circuits 41-44. The total delay value is controlled by the frequency control signal VCNT which is an output signal of the loop filter 13 of FIG. 3.

The delay circuit 41 is configured as illustrated in FIG. 5. The delay circuits 42-44 are similar to the delay circuit 41, The delay circuit 41 includes a first pair of transistors M1 and M2 which has gate terminals serving as input terminals INP and INM for receiving differential input signals. Resisters R1 and R2 are connected between a power source line and drain terminals of the transistors M1 and M2, respectively. The drain terminals serve as output terminals OUTP and OUTM. A pair of current source circuits I1 and I2 is commonly connected to source terminals of the transistor M1 and M2. A couple of switches (or transistors) S1 and S2 are connected to the current source circuits I1 and I2 to control on/off of current paths of the current source circuits I1 and I2.

The current source circuits I1 and I2 receive the frequency control signal VCNT output from the loop filter 13. The current source circuits I1 and I2 pass electric current according to the frequency control signal VCNT. The electric currents passing through the current source circuits I1 and I2 increase/decrease according to increase/decrease of the voltage of the frequency control signal VCNT.

A delay value of the delay circuit 41 varies according to the electric currents passing therethrough. When the electric currents become small, the delay value becomes large and oscillation frequency of the VCO 31 becomes small. To the contrary, when the electric currents become large, the delay value becomes small and the oscillation frequency of the VCO 31 becomes large.

In the delay circuit 41, two current paths are composed of the current source circuits I1 and I2 and the switches S1 and S2. The switches S1 and S2 are controlled by the bits GAIN1 and GAIN2 of the gain switching signal GAIN. The switches SI and S2 change a total current passing through the delay circuit 41 in response to the bits GAIN1 and GAIN2 and thereby change a variable range of the delay value. Therefore, the VCO 31 has the variable oscillating frequency characteristic (or the selectable oscillating frequency characteristics).

Though the number of the bits of the gain switching signal GAIN and the number of the current paths are equal to two each in this embodiment, they are not limited. When the numbers are equal to N (N>=3) each, the VCO 31 has $2^N$ of the selectable oscillating frequency characteristics.

As mentioned above, the VCO 31 of this embodiment controls on/off states of the current paths for regulating the currents according to the gain switching signal GAIN of the plural bits, which are the output signal of the gain control circuit 32, and thereby it can change the oscillating frequency characteristic in incremental steps. That is, when the delay values of the delay circuits 41-44 are reduced stepwise, the oscillating frequency of the VCO 31 increases stepwise. To the contrary, when the delay values of the delay circuits 41-44 are increased stepwise, the oscillating frequency of the VCO 31 decreases stepwise.

Figure 6:
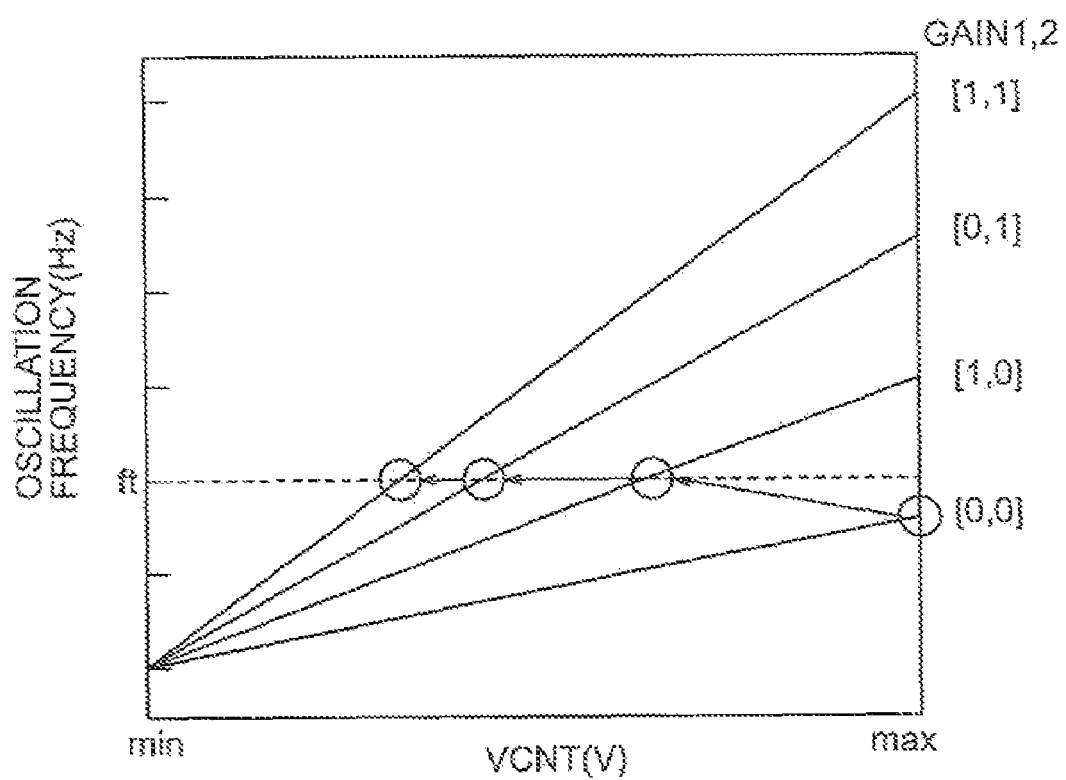
FIG. 6 is a graph showing four oscillating frequency characteristics of the voltage controlled oscillator and state transition of the phase locked loop circuit of FIG. 3.
Figure 7:
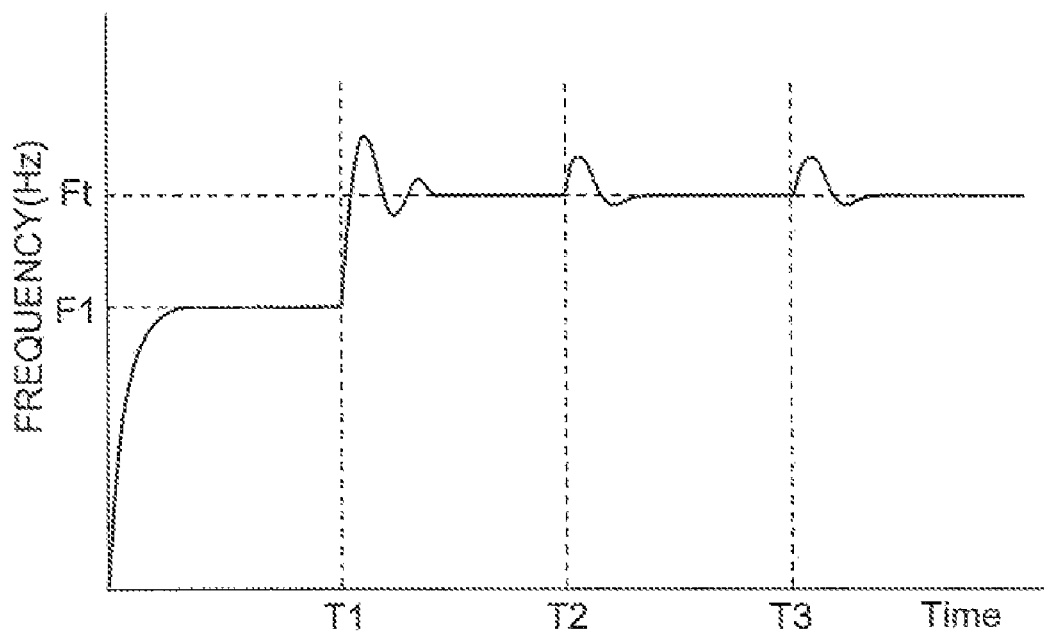
FIG. 7 is a graph showing frequency transition of an output clock signal of the phase locked loop circuit of FIG. 3.

Next, the operation of the PLL circuit of this embodiment will be described with reference to FIGS. 6 and 7. FIG. 6 is a graph showing oscillating frequency characteristics of the VCO 31 and lock states of the PLL circuit. FIG. 7 is a graph for describing the lock process of the PLL circuit of this embodiment.

At first, when the PLL circuit is initialized, the encoder (321 of FIG. 3) produces the gain switching signal GAIN so that the oscillating frequency characteristic of the VCO 31 has the smallest gain factor. Such a gain switching signal GAIN is represented by the two bits of [GAIN1, GAIN2]=[0, 0] in this embodiment. The initialization of the PLL circuit is also executed when it is started to supply the electric power to the PLL circuit.

As illustrated in FIG. 6, when the gain switching signal GAIN represents [0, 0], the oscillation frequency of the VCO 31 is lower than the target frequency Ft even if the voltage control signal VCNT has the maximum value. Accordingly, in this situation, the feedback frequency of the PLL circuit is lower than the reference frequency. Thus, the PLL circuit maintains the maximum value of the frequency control signal VCNT to increase the oscillating frequency of the VCO 31. As a result, the VCO 31 oscillates at the maximum oscillating frequency F1 on condition that the gain switching signal represents [0, 0].

The timer 322 clocks an elapsed time from when the initialization of the PLL circuit is executed. After a predetermined time T1 is elapsed from when the initialization of the PLL circuit is executed, the timer 322 supplies the control signal for the encoder 321 to change the gain switching signal GAIN. The predetermined time T1 is decided to be longer then a time required for a stable operation that the PLL circuit is locked. However, in this case, the predetermined time T1 may be longer than a time requited for the maximum oscillating frequency F1 on the condition mentioned above because the VCO 31 can not be locked at the target frequency Tf.

On receiving the control signal from the timer 322, the encoder 321 changes the gain control signal GAIN from [GAIN1, GAIN2]=[0, 0] to [GAIN1, GAIN2]=[1, 0] to increase the gain factor of the VCO 31 by one step. The changed gain control signal GAIN is supplied to the VCO 31 and thereby the VCO 31 increases the oscillating frequency without change of the frequency control signal VCNT from the loop filter 13. As shown in FIG. 6, when the gain control signal GAIN represents [1, 0], an oscillating frequency range of the VCO 31 includes the target frequency Ft. Therefore, the PLL circuit is locked at the target frequency Ft by the time instant T2 of FIG. 7. The time difference T2−T1 is decided to be longer than a time required for a stable operation that the PLL circuit is locked at the target frequency Ft. The time difference T2−T1 may be or not be equal to the predetermined time T1.

When the timer 322 judges that the time instant T2 is come, it supplies the control signal for the encoder 321 again to change the gain switching signal GAIN. On receiving the control signal from the timer 322, the encoder 321 further changes the gain control signal GAIN from [GAIN1, GAIN2]=[1, 0] to [GAIN1, GAIN2]=[0, 1] to increase the gain factor of the VCO 31 by one step.

When the gain control signal GAIN is changed into [GAIN1, GAIN2]=[0, 1] by the encoder 321, the oscillating frequency of the VCO 31 is instantaneously changed. Thereafter the VCO 31 is locked at the target frequency Ft because the oscillating frequency range of the VCO 31 includes the target frequency in this case.

When a time instant T3 is come, the timer 322 newly supplies the control signal for the encoder 321 to change the gain switching signal. On receiving the control signal from the timer 322, the encoder 321 still further changes the gain control signal CAIN from [GAIN1, GAIN2]=[0, 1] to [GAIN1, GAIN2]=[1, 1] to increase the gain factor of the VCO 31 by one step.

When the gain control signal GAIN is changed by the encoder 321, the oscillating frequency of the VCO 31 is instantaneously changed. Thereafter the VCO 31 is also locked at the target frequency Ft because the oscillating frequency range of the VCO 31 includes the target frequency also in this case.

Thus, the PLL circuit of this embodiment repeats the operation mentioned above until the VCO 31 has the desired oscillating frequency characteristic (or the maximum gain factor). Accordingly, overshoots are suppressed in the locking process of the PLL circuit as illustrated in FIG. 7. FIG. 7 shows the frequency transition of the output clock signal. In FIG. 7, a vertical line expresses the output frequency while a horizontal line expresses the time.

As mentioned above, the PLL circuit of this embodiment uses the VCO 31 having a plurality of oscillating frequency characteristics and employs one of the oscillating frequency characteristics stepwise. As a result, the oscillating frequency of the VCO 31 is restricted within a frequency band of the feedback path of the PLL even if the frequency control signal VCNT is equal to a power source level at the beginning of supplying electric power to LSI included in the PLL circuit. Thus, the PLL circuit can be normally locked at the target frequency Pt.

While this invention has thus far been described in conjunction with the preferred embodiment thereof, it will readily be possible for those skilled in the art to put this invention into practice in various other manners.

For example, the number of selectable gain factors of the VCO 31 may be larger than four. In such a case, instantaneous variation of the output frequency is reduced when the employed gain factor is changed.

Furthermore, setting way of the gain switching signal may be adjusted to optimize loop characteristic of the PLL circuit. In this case, the jitters on the output clock signal are further suppressed.

What is claimed is:

1. A phase locked loop circuit comprising:
   a phase comparator for comparing a phase of a feedback signal with that of a reference clock signal;
   a charge pump connected to said phase comparator for producing an analog signal corresponding to a pulse width of an output signal from said phase comparator;
   a loop filter connected to said charge pump for smoothing the analog signal to produce a frequency control signal;
   a voltage controlled oscillator connected to said loop filter for producing an output clock signal according to oscillating characteristic value based at least in part on the frequency control signal;
   a frequency divider connected between said voltage controlled oscillator and said phase comparator for dividing the output clock signal to supply a divided signal as the feedback signal to said phase comparator;
   a gain controller connected to said voltage controlled oscillator that produces a switching signal, said voltage controlled oscillator increasing the oscillating frequency characteristic value stepwise by means of controlling a delay value of a delay circuit included therein according to a stepwise increase in the switching signal, a time of the switching signal being based on an elapsed timing from initialization of the phase locked loop circuit.

2. A phase locked loop as claimed in claim 1, said gain controller comprising an encoder for producing the switching signal consisting of a plurality of bits.

3. A phase locked loop as claimed in claim 2, wherein said encoder increases a value represented by the switching signal stepwise according to a control signal.

4. A phase locked loop as claimed in claim 3, said gain controller further comprising a timer connected to said encoder for producing the control signal at a predetermined timing.

5. A phase locked loop circuit comprising:
   a voltage controlled oscillator employing one of oscillating frequency characteristics according to a switching signal; and
   an oscillating characteristic controller connected to said voltage controlled oscillator for changing the switching signal according to an elapsed time, said oscillating characteristic controller including: a timer for timing the elapsed time commenced by initialization of the phase locked loop circuit; and an encoder connected to said timer for producing the switching signal on the basis of the elapsed time, wherein said voltage controlled oscillator includes a delay circuit having a delay value determining an employed characteristic value, and
   wherein the switching signal decreases the delay value to increase the employed characteristic value.

6. A phase locked loop circuit as claimed in claim 5, wherein the oscillating frequency characteristics are employed one by one in predetermined order.

7. A phase locked loop circuit as claimed in claim 5, wherein the oscillating frequency characteristics are represented by characteristic values, and
   wherein the switching signal increases the employed characteristic value employed by said voltage controlled oscillator according to the elapsed time.

8. A phase locked loop circuit as claimed in claim 7, wherein the employed characteristic value increases stepwise.

9. A phase locked loop circuit as claimed in claim 5, wherein the delay value decreases stepwise.

10. A controlling method for controlling a phase locked loop circuit, comprising the steps of:
    producing a switching signal changed according to an elapsed time from initialization of the phase locked loop circuit; and
    supplying the switching signal to a voltage controlled oscillator to employ one of oscillating frequency characteristics, the oscillating frequency characteristics being employed one by one in predetermined order on the basis of the switching signal, wherein said voltage controlled oscillator includes a delay circuit having a delay value determining an employed oscillating characteristic value, and
    wherein the switching signal decreases the delay value to increase the employed characteristic value.

11. A controlling method as claimed in claim 10, wherein the oscillating frequency characteristics are represented by oscillating characteristic values, and
    wherein the switching signal increases the employed oscillating characteristic value employed by said voltage controlled oscillator according to the elapsed time.

12. A controlling method as claimed in claim 11, wherein the employed oscillating characteristic value increases stepwise.

13. A controlling method as claimed in claim 10, wherein the delay value decreases stepwise.

* * * * *